United States Patent [19]

Shimizu et al.

[11] Patent Number: 4,875,048

[45] Date of Patent: Oct. 17, 1989

[54] TWO-STEP PARALLEL ANALOG TO DIGITAL CONVERTER

[75] Inventors: Toshihiko Shimizu, Tokyo; Masao Hotta, Hanno; Kenji Maio, Tokyo, all of Japan

[73] Assignee: Hitachi, Ltd., Tokyo, Japan

[21] Appl. No.: 237,757

[22] Filed: Aug. 29, 1988

[30] Foreign Application Priority Data

Aug. 28, 1987 [JP] Japan ............... 62-212747

[51] Int. Cl.$^4$ ............. H03K 13/02; H03M 1/36
[52] U.S. Cl. ............. 341/156; 341/159; 341/120; 341/110
[58] Field of Search ............. 341/110, 156, 159, 120

[56] References Cited

U.S. PATENT DOCUMENTS

| | | | |
|---|---|---|---|
| 4,227,183 | 10/1980 | Nimomiya | 341/156 |
| 4,559,523 | 12/1985 | Wakita | 341/156 |
| 4,612,533 | 9/1986 | Evans | 341/120 |
| 4,639,715 | 1/1987 | Doluca | 341/120 |
| 4,763,106 | 8/1988 | Gulczynski | 341/159 |
| 4,774,498 | 9/1988 | Traa | 341/159 |

OTHER PUBLICATIONS

IEEE International Conference on Consumer Electronics, Watanabe et al., Jun. 1984, pp. 150-151.

*Primary Examiner*—William M. Shoop, Jr.
*Assistant Examiner*—Helen Kim
*Attorney, Agent, or Firm*—Antonelli, Terry & Wands

[57] ABSTRACT

In a two-step parallel analog to digital converter of the type in which a first flash-type A/D converter determines the upper significant bits of a digital signal output having a desired number of bits and after a quantizing error of the first flash-type A/D converter has been determined from the difference between a value obtained by reconverting the upper significant bits to an analog value and the input analog value a second flash-type A/D converter subjects the quantizing error to A/D conversion to determine a digital output of the remaining lower significant bits, a gain correcting circuit is additionally provided to automatically establish a gain of a D/A converter for reconverting the upper significant bits to an analog value on the basis of a reference voltage applied to the first flash-type A/D converter. Moreover, a reference voltage generating circuit is additionally provided to establish upper and lower reference voltages of a second flash-type A/D converter for determining lower significant bits on the basis of the step voltage of the DAC output.

9 Claims, 5 Drawing Sheets

TWO-STEP PARALLEL ANALOG TO DIGITAL CONVERTER

BACKGROUND OF THE INVENTION

The present invention relates to a two-step parallel analog to digital converter capable of realizing fast and highly accurate A/D conversion with a circuitry of a practical scale and more particularly to the prevention of any conversion error in its lower significant bits.

A typical example of the conventional high-speed A/D converters is the so-called flash type. With this type of A/D converter, the scale of its circuitry increases in an exponential function in proportion to an increase in the number of bits in a digital output. On the other hand, a two-step parallel A/D converter can realize a fast and highly accurate A/D convertion and an A/D converter having a relatively large number of output bits with a reasonable circuit scale and an example of this type is described in the Digest of Papers, International Conference on Consumer Electronics, June 8, 1984, pp. 150-151. In a conventional two-step parallel A/D converter shown in FIG. 9 of the accompanying drawings, a first flash type A/D converter including a comparator group 802, a latch circuit group 803, a binary encoder 804 and a latch circuit group 805 converts an analog input 801 to a digital signal and determines upper significant bits 816. On the other hand, a segment current-type D/A converter (hereinafter referred to as a DAC) 808 which receives the outputs of the latch circuit group 803 and including a resistor group 806 connected to these latch circuit outputs and a resistor 807 connected to the resistor group 806 reconverts the digital signal of the upper significant bits to an analog value. A subtracting circuit 810 determines the difference between the analog input delayed for a time corresponding to the time required for the conversion in the first A/D converter and the DAC by a delay circuit 809 and the D/A converted output and the difference is amplified by an amplifier 811. The result is subjected to A/D conversion by a second flash-type A/D converter including a comparator groups 812, a latch circuit group 813, a binary encoder 814 and a latch circuit group 815, thereby determining lower significant bits 817.

Thus, with the two-step parallel A/D converter, the conversion quantizing error of the first flash-type A/D converter is subjected to A/D conversion by the second flash type A/D converter. As a result, it is impossible to ensure the desired accuracy down to the lower significant bits unless the following two conditions are satisfied:

(a) An quantizing error is always obtained accurately.
(b) The quantizing error obtained is accurately converted to a digital signal of the lower significant bits.

To satisfy the condition (a), there must be the equality between the full scale value of the output variation of the D/A converter for reconverting the digital output of the upper significant bits and the full scale value of the input applied to the first flash-type A/D converter. Otherwise, the subtractor output includes not only the quantizing error of the first flash-type A/D converter but also an offset varying in dependence on the voltage level of the input analog signal. On the other hand, to satisfy the condition (b) requires that the full scale value of the subtractor output corresponding to the quantizing error coincide with the input full scale range of the second flash-type A/D converter. In the example shown in FIG. 9, satisfying these conditions requires that not only the value of the output resistor 807 of the DAC 808 or the values of the individual (segment) resistors 806 are adjusted but also the gain of the subtracting amplifier 811 or the values of upper and lower reference voltages applied to the comparator group of the second flash-type A/D converter are adjusted. Particularly in the case of IC A/D converters, there are disadvantages that it is necessary to provide terminals for such adjusting purposes with the resulting increase in the number of the package pins, that the high speed performance is deteriorated by an increase in the parasitic capacitance due to the provision of a pin for detecting the output voltage of the DAC 808 and so on.

SUMMARY OF THE INVENTION

It is an object of the present invention to provide a two-step parallel analog to digital converter which has reduced number of points requiring adjustment, yet which maintains the high speed and highly accurate performance.

It is another object of the invention to provide a two-step parallel analog to digital converter which is suited for configuration with monolithic ICs.

A feature of the present invention resides in the provision of a gain correcting circuit whereby on the basis of a signal indicative of the quantized step level of a first flash-type A/D converter for determining upper significant bits, a step voltage of the output from a D/A converter for reconverting the digital signal of the upper significant bits to an analog signal is set automatically. The signal indicative of the quantized step level of the first flash-type A/D converter is generated from the two terminals of a series resistor group for producing reference voltages for the first flash-type A/D converter. By virtue of this configuration, the difference between the output of the D/A converter and the analog input always accurately indicates the quantizing error of the first flash-type A/D converter.

Another feature of the invention resides in that in addition to the above-mentioned construction, a circuit is added which establishes upper and lower reference voltages for a second flash-type A/D converter for determining lower significant bits on the basis of the step voltage of the output of the D/A converter. The step size voltage the output of the D/A converter can be determined by a current source forming a Miller circuit along with the current sources for the respective segments of the D/A converter. In accordance with this configuration, by only applying externally the upper and lower reference voltages of the first flash-type A/D converter, the desired adjustments can be effected automatically and the analog to digital converter becomes free for any conversion error, thereby making the configuration particularly effective in the case of IC analog to digital converters.

DESCRIPTION OF THE PREFERRED EMBOD

Figure 1:
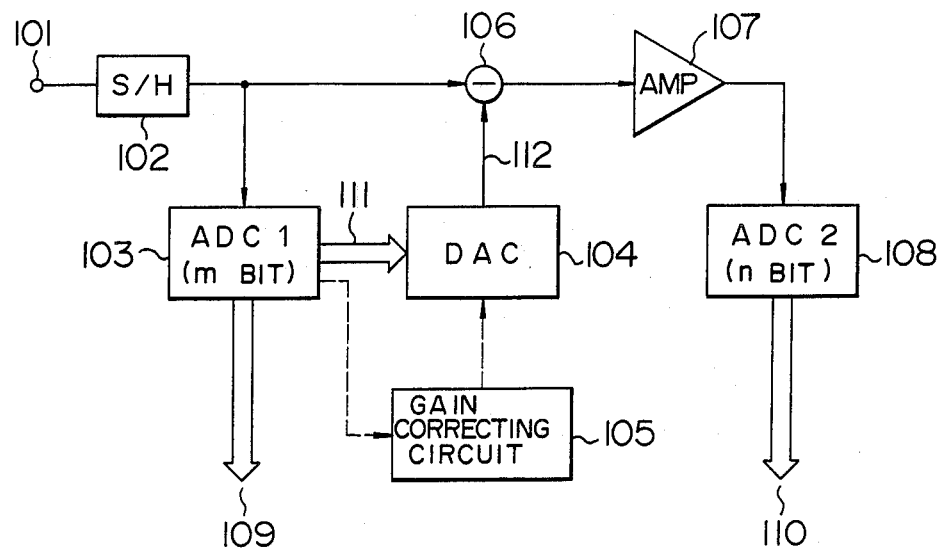
FIG. 1 is a block diagram if an analog to digital converter according to a first embodiment of the present invention.

A first embodiment of the invention will now be described with reference to FIG. 1 and 2. The embodiment of FIG. 1 includes a sample-and-hold circuit 102 for sampling and holding an input 101, a first flash-type A/D converter 103 for subjecting the sampled and held output to A/D conversion to generate a digital output 109 of the upper significant bits (m bits), a D/A converter 104 for reconverting the upper significant bits to an analog value, a subtracting circuit 106 and an amplifier 107 for subtracting the on of the DAC 104 from the output of the sample-and-hold circuit 102 and amplifying the difference, a second lash-type A/D converter 108 for subjecting the ifier output to A/D conversion to generate a digital out 110 of the lower significant bits (n bits), and a gain correcting circuit 105 for receiving the quantized level of the A/D converter 103 to correct the step of the output variation of the D/A converter 104. 111 designates a thermometer code signal generated in the course of generation of a binary coded signal 109 produced by the first flash-type converter 103 whereby reconverting the thermometer code signal to an analog signal, the D/A converter 104 may be comprised of a segment current type D/A converter which is reduced in conversion error even during the high speed operation. With the above-mentioned two-step parallel analog to digital converter, its overall digital output is generated as a binary coded signal of the total bits (m+n) of the output 109 and 110.

Figure 2:
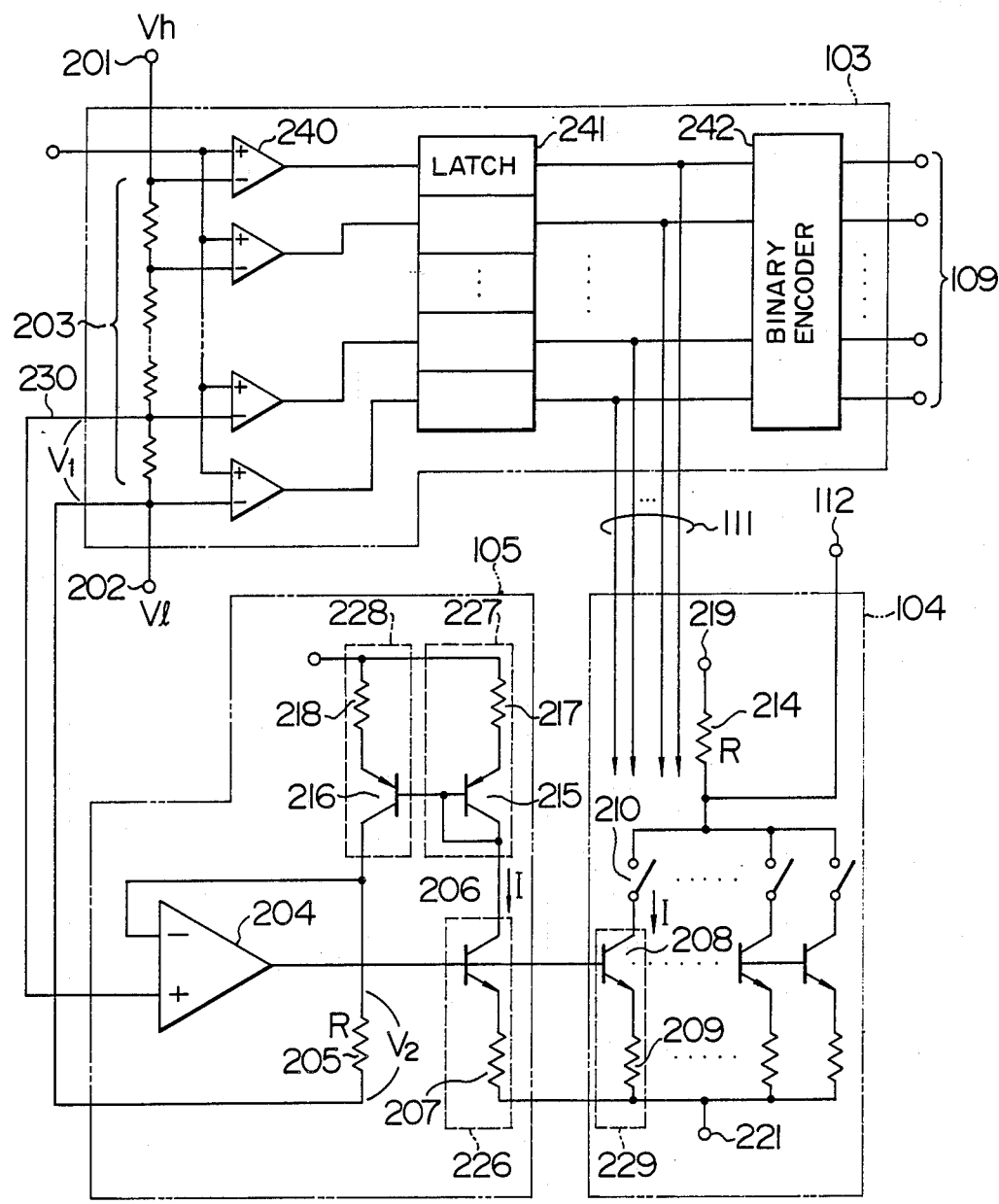
FIG. 2 is a circuit diagram showing principal parts of the analog to digital converter of FIG. 1.

The embodiment of FIG. 1 is featured the gain correcting circuit 105, and FIG. 2 shows in detail the gain correcting circuit 105 as well as the first flash-type A/D converter 103 and the D/A converter 104 operatively associated with the former. The first flash-type A/D converter 103 includes a comparator group 240 of $(2^m-1)$ comparators. This comparator group parallel compare in level the respective reference voltages having the regular-interval potential differences of the $(2^m-1)$ steps and the sample-and-hold analog input generated from the sample-and-hold circuit 102. These reference voltages are provided by a series resistor array 203 whose ends 201 and 202 are respectively supplied with higher reference voltage Vh and lower reference vo Vl. The $(2^m-1)$ bits thermometer code signal produced by the comparator group 240 is latched by a latch circuit group 241 and its result is then converted to an m-bit binary coded signal by a binary encoder 242. The output of the binary encoder 242 is the output 109 corresponding to the upper significant m bits of the (m+n) bit digital output. It is to be noted that the second flash type A/D converter 108 of FIG. 1 for determining the lower significant n bits is also the same circuit construction an the A/D converter 103 of FIG. 2. On the other hand, the segment-current type D/A converter 104 includes $(2^m-1)$ segment switches 210 which are each connected in series with a current source 229 including a transistor 208 and a resistor 209. These series circuits are connected in parallel with one another and a load resistor 214 is connected to one end of the parallel circuit. A voltage supply is connected between the open end of the load resistor 214 and the other end of the parallel circuit. The on-off operation of each of the $(2^m-1)$ segment switches 210 is controlled by the output 111 generated from the first flash-type A/D converter 103. As a result, a voltage drop proportional to the number of the high-level bits in the thermometer code is caused across the load resistor 214. In this way, the analog voltage to which the thermometer code is reconverted is generated at another end 112 of the load resistor 214. The step voltage of this analog voltage is given as I·R where I represents the current value of each constant current source 229 and R represents the value of the load resistor 214.

Then, the quantized step of the first flash-type A/D converter 103 corresponds to the voltage $V_1$ between the adjacent term of the series resistor array 203. Thus, the gain correcting circuit 105 controls the value of I in such a manner that the output step voltage I·R of the D/A converter 104 coincides with the quantized step level of the first A/D converter. The gain correcting circuit 105 comprises a current source 226 including a transistor 206 and a resistor 207 and forming a Miller circuit along with the current sources 229, a current source 227 including a transistor 215 connected to the collector of the transistor 206 a resistor 217, a current source 228 including a transistor 216 and a resistor 218 and forming a Miller circuit together with the current source 227, a resistor 205 connected to the collector of the transistor 216 at one side and supplied with the reference voltage V1 at another side, and an operational amplifier 204 adapted to receive as a negative-phase input the collector output of the transistor 216 and as a positive-phase input the reference voltage next in level to the V1 obtained at a terminal 230 of the series resistor array 203 and having its output connected to the base of the transistor 206 and the base of each of the segment current sources 229 of the D/A converter 104. If the base currents of the transistors 215 and 216 are ignored, due to the above-mentioned construction, the same current I flows to the current source 226, 227, 228 and 229 and also the same current I flows in the resistor 205. Here, the resistor 205 comprises one having the same resistance value as the resistance value R of the resistor 214. Then, a voltage $V_2$ indicative of the step voltage R·I of the output from the D/A converter 104 is applied to the negative-phase input and the voltage $V_1$ indicative of the quantized step level of the first flash-type A/D converter 103 is applied to the positive-phase input so that the operational amplifier 204 varies the current I to the current sources 229 for the segments of the D/A converter 104 to cause the voltages $V_1$ and $V_2$ to become equal to each other.

Thus, in accordance with the present embodiment, with the simple construction, the quantized step levels of the first A/D converter 103 and the D/A converter 104 can be automatically corrected and the output of the subtracting circuit 106 indicates accurately only the quantizing error of the first A/D converter 103 (or the sum of this value and a given offset irrespective of the voltage level of the analog input. Thus, by then adjusting the gain of the amplifier 107 or the higher and lower reference voltages applied to the second flash-type A/D converter 108, it is possible to effect the (m+n) bit A/D conversion without any error.

Figure 3:
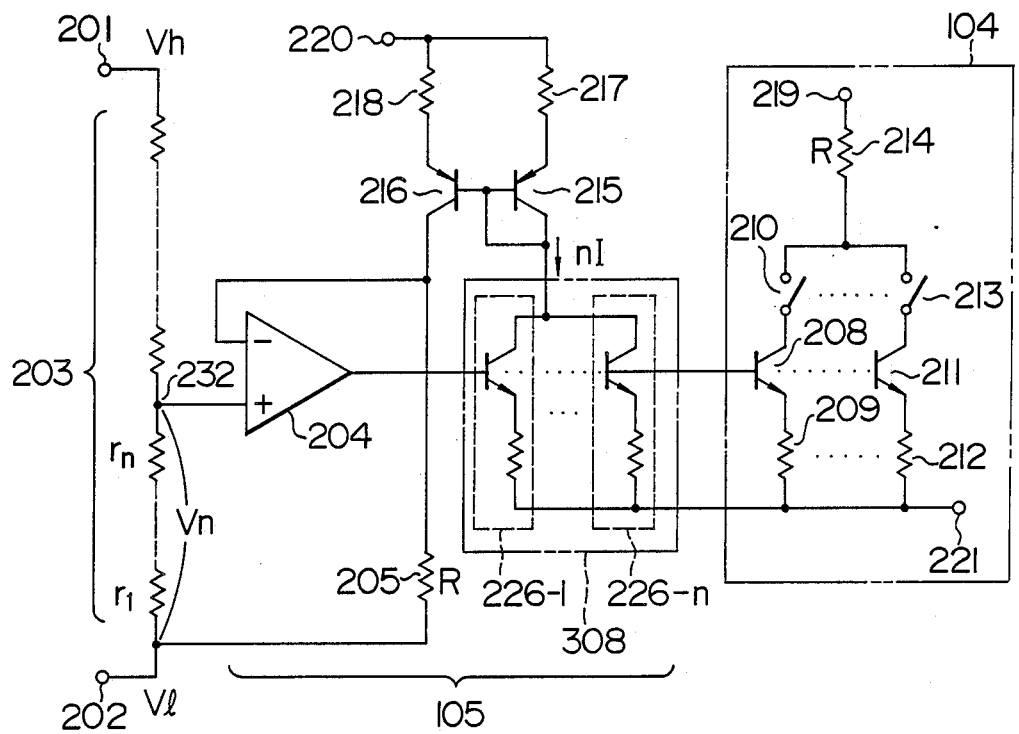
FIG. 3 is a circuit diagram showing a modification of FIG. 2.

Referring to FIG. 3, there is illustrated another example of the gain correcting circuit 105 in the embodiment of FIG. 1. The current source 226 forming a Miller circuit along with the segment current sources 229 is replaced with a current source 308 including a plurality (n units) of parallel-connected current sources 226-1 to 226-n so that the voltage drop across the resistor 205 is n times the output step voltage of the D/A converter 104. Similarly, the nth reference voltage generated from a terminal 232 of the nth resistor from below in the series resistor array 203 is applied to the positive-phase input of the operational amplifier 204. By thus comparing the quantized step level of the first A/D converter 103 and the output step voltage of the D/A converter 104 with their n-fold values, the error due to the deviation of 1 quantized step level is reduced to a $1/\sqrt{n}$ so that in addition to the effect of the first embodiment, there is a great effect that the quantized step level can be adjusted with greater accuracy.

Figure 4:
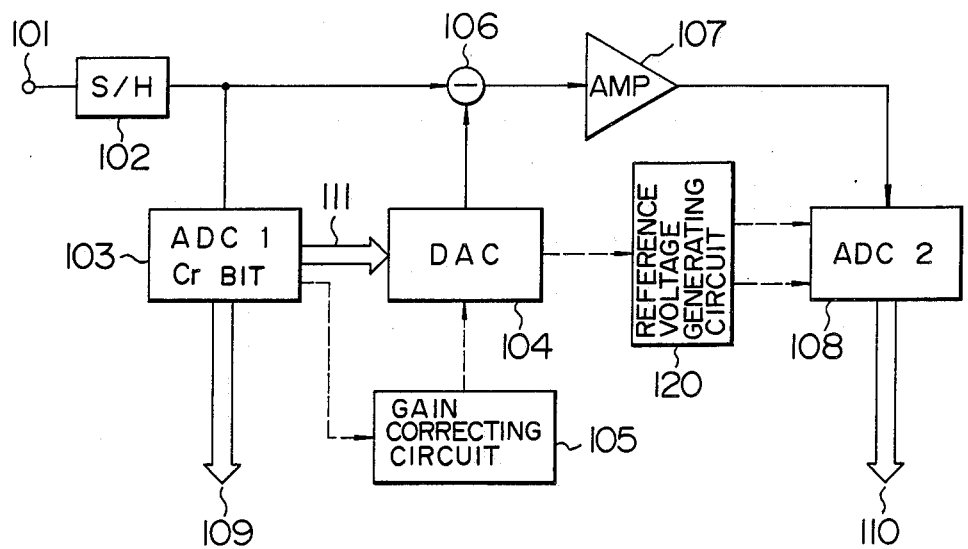
FIG. 4 is a block diagram if an analog to digital converter showing a second embodiment of the invention.
Figure 5:
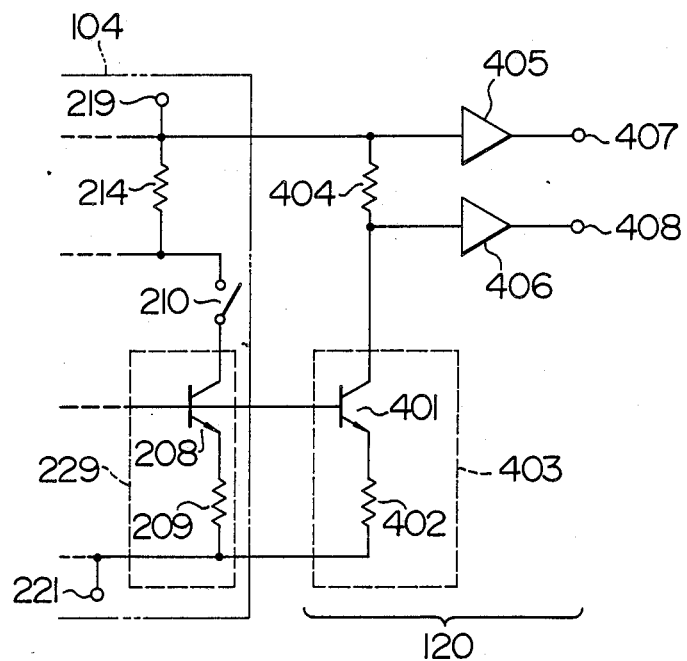
FIG. 5 is a circuit diagram of a principal part of the embodiment of the invention in FIG. 4.

Referring to FIG. 4, there is illustrated a block diagram showing the overall configuration of another embodiment of the invention. This embodiment differs from the embodiment of FIG. 1 in that a reference voltage generating circuit 120 is added which automatically establishes a reference voltage range of the second flash-type A/D converter 108. The remainder of the configuration is all the same with FIG. 1. In other words, the gain correcting circuit 105 automatically adjusts the gain of the D/A converter 104 in a manner that the output step voltage of the D/A converter 104 coincides with the quantized step level of the first flash-type A/D converter 103. By so doing, the difference between the analog input and the output of the D/A converter 104 does not depend on the input level and it has a given offset. More specifically, the current value of the current sources 229 for the segments of the segment current-type DAC 104 is adjusted by the gain correcting circuit 105 in accordance with the circuit configuration of FIG. 2 or 3. On the other hand, the reference voltage generating circuit 120 peculiar to this embodiment has the configuration shown in FIG. 5. In other word, the circuit 120 includes a constant current source 403 (including a transistor 401 and a resistor 402) forming a Miller circuit along with the segment current sources 229 of the D/A converter 104 as mentioned previously and a resistor 404 having its one end connected to the current source 403 and other end connected to the power supply 219. The resistor 404 has the same resistance as the output load resistor 214 of the D/A converter 104. The two potential developed at the ends of the resistor 404 are respectively amplified by amplifiers 405 and 406 with the same gain as the subtracting amplifier (107 in FIG. 4), thereby producing reference voltage high-potential and low-potential sides 407 and 408. The potential drop across the resistor 404 is the product of the same segment-current source as the DAC and the resistor and thus it coincides with the output step voltage of the D/A converter 104. Then, the full scale of the subtracting amplifier output is attained when the difference between the analog input and the DAC output coincides with the output step voltage of the D/A converter 104 and therefore it coincides with the potential drop across the resistor 404. Thus, the second A/D converter 108 can perform the A/D conversion without causing any conversion error (e.g., overflow) or insufficient gain. Thus, in accordance with the present embodiment, there is no need to externally establish the reference voltages for the second flash-type A/D converter 108 and the present embodiment is particularly advantageous from the standpoint of utilization of ICs.

Figure 6:
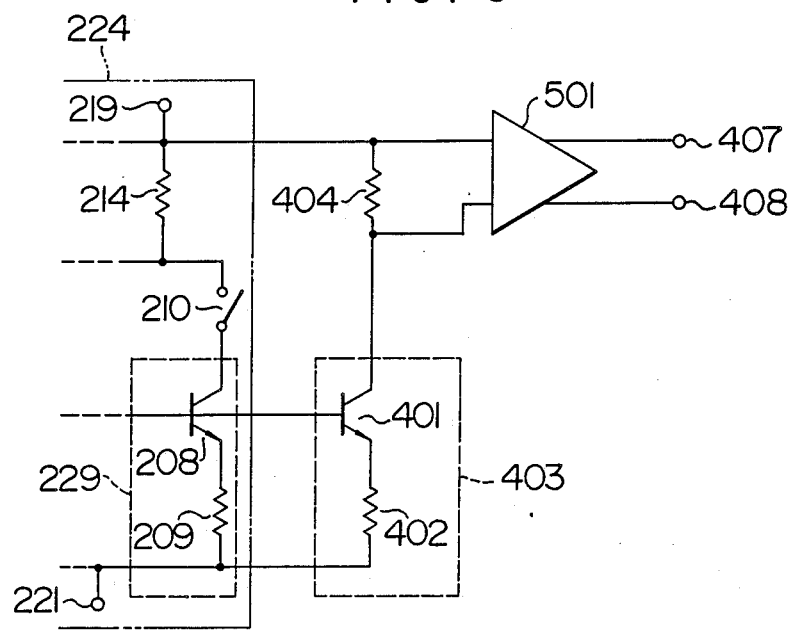
FIG. 6 is a circuit diagram showing a modification of FIG. 5.
Figure 7:
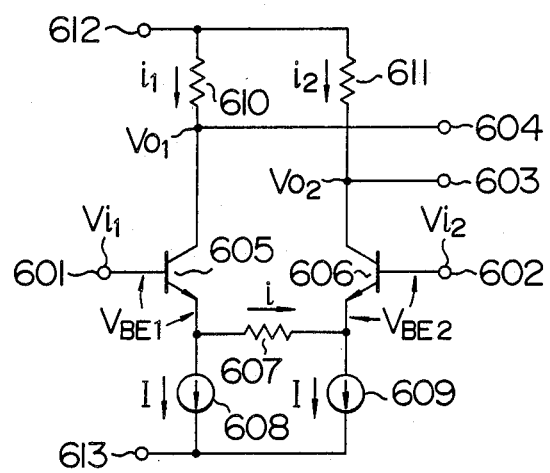
FIG. 7 is a circuit diagram of the subtracting amplifier forming a component part of FIG. 5.
Figure 8:
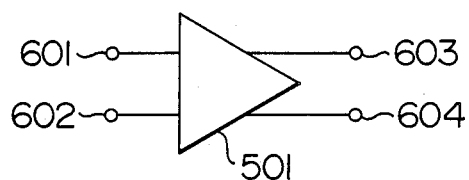
FIG. 8 is a block diagram if the subtracting amplifier of FIG. 6.
Figure 9:
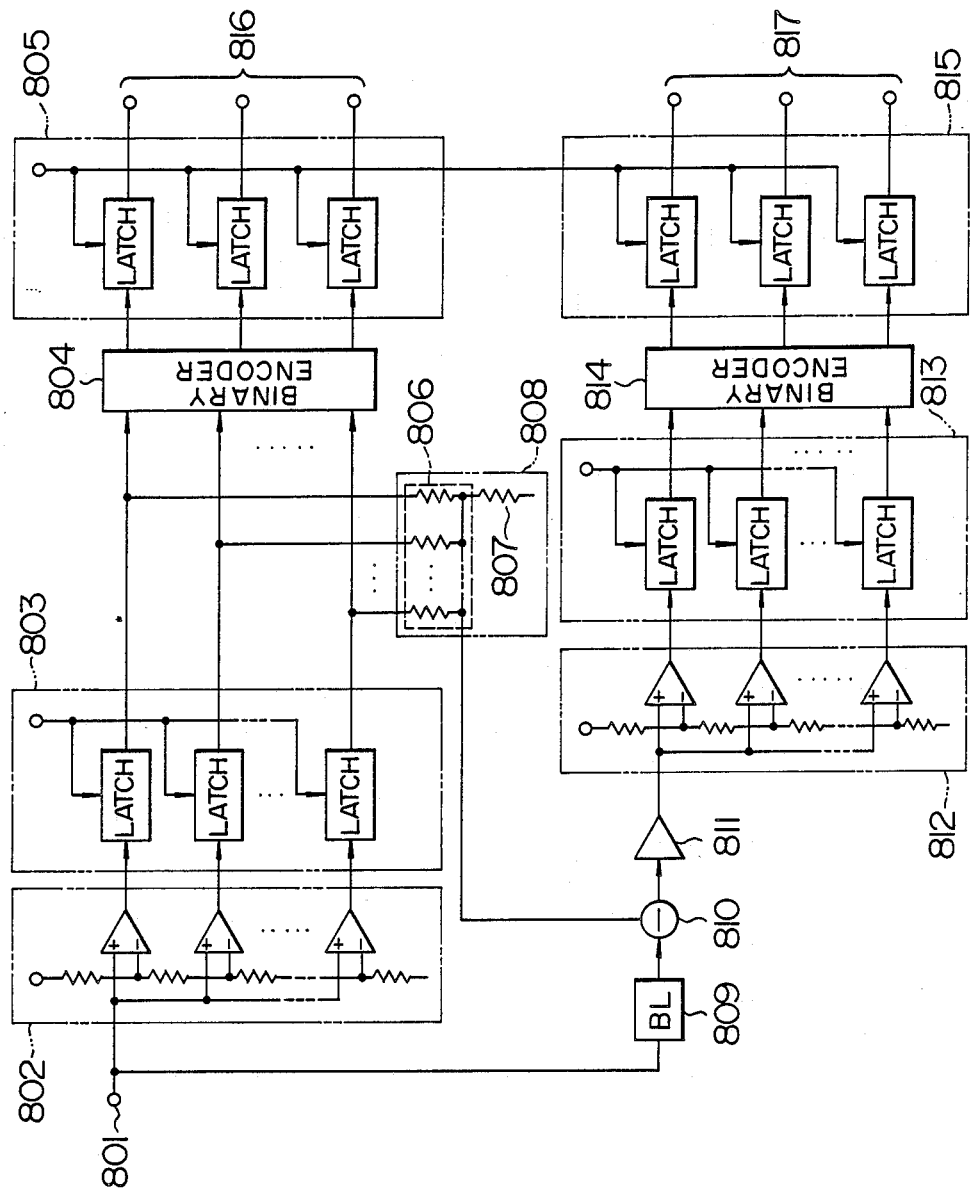
FIG. 9 is a diagram showing the configuration of a conventional two-step parallel analog to digital converter.

Referring now to FIG. 6, there is illustrated another example of the reference voltage generating circuit 120 in the embodiment of FIG. 4. As in the case of FIG. 5, the same level as the output step voltage of the D/A converter 104 is produced by the product of the constant current source 403 forming Miller circuit along with the segment current sources of the D/A converter 104 and the resistor 404 of the same resistance as the output load resistor 214 of the DAC 104. A subtracting amplifier 501 receives the said level at its one input and the power supply voltage 219 at another input, thereby generating complementary subtracting amplifier outputs 407 and 408. FIG. 7 shows the configuration of the subtracting amplifier 501 and FIG. 8 shows its block diagram. In the configuration of FIG. 7, constant current sources 608 and 609 are respectively connected to the emitters of transistors 605 and 606 whose base inputs are inputs 601 and 602, respectively, and a resistor 607 is connected between the emitters of the transistors 605 and 606 whose collectors are connected to load resistors 610 and 611, respectively.

If $V_{i1}$ and $V_{i2}$ represent applied to the terminals 601 and 602, respectively, $V_{BE1}$ and $V_{BE2}$ the base-emitter voltages of the transistors 605 and 606, respectively, I the current value of the constant current sources 608 and 609, $i$, $i_{i1}$ and $i_{i2}$ the currents flowing in the resistors 607, 610 and 611, respectively, R the value of the resistor, 607, $R_C$ the value of the resistor 610 or 611, and $V_{01}$ and $V_{02}$ the subtracting amplifier outputs 603 and 604, respectively, then the following relations are obtained $$i = \{(V_{i1} - V_{BE1}) - (V_{i2} - V_{BE2})\}/R \qquad (1)$$

$$i_1 = I + i \qquad (2)$$

$$i_2 = I - i \qquad (3)$$

$$V_{01} = R_c \cdot i_1 = R_c \cdot I + R_c \cdot i \qquad (4)$$

$$V_{02} = R_c \cdot i_2 = R_c \cdot I - R_c \cdot i \qquad (5)$$

Assuming now that the voltages $V_{BE1}$ and $V_{BE2}$ are equal, the following hold $$V_{01} = R_cI + (R_c/R) \cdot (V_{i1} - V_{i2}) \qquad (4)'$$

$$V_{02} = R_cI - (R_c/R) \cdot (V_{i1} - V_{i2}) \qquad (5)'$$

Therefore, the potential difference between the output terminals is given as $$\Delta V = 2 \cdot (R_c/R) \cdot (V_{i1} - V_{i2}) \qquad (6)$$

Thus, the resulting amplitude is twice the subtracting amplifier output. If it is desired that the potential difference coincides with the full scale of the subtracting amplifier output, it is only necessary to set the input difference $(V_{i1} - V_{i2})$ to ½ of the output step voltage of the D/A converter. By thus using the subtracting amplifier of FIG. 7, it is possible to obtain a signal level of twice the full scale of the subtracting amplifier for an input of 1 quantized step level and therefore the setting of reference voltages is easy where the A/D conversion is effected with the overlapping of 1 bit between the upper significant bits and the lower significant bits.

From the foregoing description, it will be seen that by virtue of the fact that the use of Miller circuits of current sources, an operational amplifier, etc., makes it possible to automatically correct the quantized step level of a upper A/D converter and the output step voltage of a D/A converter in a two-step parallel analog to digital converter causing an analog input and the full scale of a DAC output to coincide, the result of the subtracting amplification of the analog input and the DAC output is not dependent on the input level and thus the amplified result has a given offset In addition, by producing a reference voltage range of a lower A/D converter on the basis of the output step voltage of the D/A converter, the A/D conversion free of any conversion error can be effected by making no external adjustment on the lower A/D converter.

We claim::

1. A two step parallel analog digital converter comprising:
   a first flash-type A/D converter for subjecting an analog input signal to A/D conversion to determine upper significant bits;
   a D/A converter for reconverting said upper significant bits output to an analog value;
   a subtracting amplifier of amplifying a difference signal between said D/A converted output and said analog input signal;
   a second flash-type A/D converter for subjecting the output of said subtracting amplifier to A/D conversion to determine lower significant bits and
   a gain correcting circuit for establishing an output step voltage of said D/A converter on the basis of a quantized step level of said first flash-type A/D converter.

2. An analog to digital conveter according to claim 1, wherein said quantized step level of said first flash-type A/D converter is obtained from between two terminals of a series resistor group for generating reference voltages.

3. An analog to digital converter according to claim 1, wherein said gain correcting circuit comprises an operational amplifier for receiving the output step voltage of said D/A converter and the quantized step level of said first flash-type A/D converter as positive-phase and negative-phase inputs, respectively, and wherein an output of said operational amplifier is feedback to a terminal for determining a gain of said D/A converter.

4. A two-step parallel analog to digital converter comprising:
   a first flash-type A/D converter for subjecting an analog input to A/D conversion to determine upper significant bits;
   a D/A converter for reconverting said upper significant bits output to an analog value;
   a subtracting amplifier for amplifying a difference between the output of said D/A converter and said analog input;
   a second flash-type A/D converter for subjecting the output of said subtracting amplifier to A/D conversion to determine lower significant bits;
   a circuit for correcting a gain of said D/A converter; and
   a circuit for generating references for said second flash-type A/D converter.

5. An analog to digital converter according to claim 4, wherein said gain correcting circuit establishes an output voltage size of said D/A converter on the basis of a quantized step level of said first flash-type A/D converter.

6. An analog to digital converter according to claim 5, wherein the quantized step level of said first flash-type A/D converter is obtained from the voltage between two terminals of a series resistor group for generating reference voltages.

7. An analog to digital converter according to claim 5, wherein said gain correcting circuit comprises an operational amplifier for receiving the output step voltage of said D/A converter and the quantized step level of said first flash-type A/D converter as positive-phase and negative-phase inputs, respectively, and wherein an output of said operational amplifier is fed back to a terminal for determining the gain of said D/A converter.

8. An analog to digital converter according to claim 4, wherein said reference voltage generating circuit establishes reference voltages on the basis of an output step voltage of said D/A converter.

9. An analog to digital converter according to claim 8, wherein said reference voltages are generated by amplifying the output step voltage of said D/A converter by a circuit having the same gain as said subtracting amplifier.

* * * * *